United States Patent [19]
Yu et al.

[11] Patent Number: 5,767,537
[45] Date of Patent: Jun. 16, 1998

[54] CAPACITIVELY TRIGGERED SILICON CONTROLLED RECTIFIER CIRCUIT

[75] Inventors: Ta-Lee Yu, Hsien; Konrad Kwang-Leei Young, Taipei, both of Taiwan

[73] Assignee: Winbond Electronics Corp., Hsinchu, Taiwan

[21] Appl. No.: 753,281

[22] Filed: Nov. 22, 1996

[30] Foreign Application Priority Data

Sep. 9, 1996 [TW] Taiwan ................................ 85111011

[51] Int. Cl.$^6$ ............................................ H01L 29/74
[52] U.S. Cl. .......................... 257/111; 257/154; 257/162; 257/109; 257/175; 361/100; 361/56; 361/91; 388/919
[58] Field of Search ............................ 257/154, 162, 257/111, 107, 109, 175, 532, 577, 546; 327/439, 475, 453, 438; 361/100, 205, 56, 91; 388/919

[56] References Cited

U.S. PATENT DOCUMENTS

| | | | |
|---|---|---|---|
| 3,649,887 | 3/1972 | Keller et al. | 257/546 |
| 4,223,281 | 9/1980 | Ahmed | 331/111 |
| 4,267,467 | 5/1981 | Tsukada | 327/475 |
| 4,595,941 | 6/1986 | Avery | 257/109 |
| 5,406,115 | 4/1995 | Maeda et al. | 257/592 |
| 5,504,451 | 4/1996 | Smayling et al. | 327/438 |
| 5,637,887 | 6/1997 | Consiglio | 257/109 |

FOREIGN PATENT DOCUMENTS 55-50740  4/1980  Japan .................................. 327/439

OTHER PUBLICATIONS

S. M. Sze, "Physics of Semiconductor Devices," 1981, pp. 134, and 304–306.

Primary Examiner—Jerome Jackson
Assistant Examiner—John Guay
Attorney, Agent, or Firm—Fish & Richardson, P.C.

[57] ABSTRACT

An SCR circuit formed on a semiconductor substrate includes a well region, a first diffusion region and a second diffusion region in the well region, and a third diffusion region in the substrate. The SCR circuit also includes a capacitor connected between the first diffusion region and the third diffusion region. The junction region between the well region and the diffusion region is forward biased when an electrostatic force is applied to the SCR circuit, thereby triggering the SCR circuit to discharge the electrostatic force.

8 Claims, 4 Drawing Sheets

CAPACITIVELY TRIGGERED SILICON CONTROLLED RECTIFIER CIRCUIT

BACKGROUND OF THE INVENTION

1 Field of the Invention

The present invention relates to a semiconductor integrated circuit, and more specifically, to a silicon controlled rectifier (SCR) for use in electrostatic discharge (ESD) applications with integrated circuits.

2 Description of Related Art

The SCR circuit has been widely employed in integrated circuits for preventing internal or external electrostatic damage. Referring to FIG. 1, a conventional SCR device fabricated in an N-type semiconductor substrate 10 includes a P-type well 20 and a number of diffusion regions. A cathode of the SCR is formed by a P$^+$ diffusion region 22 and a N$^+$ diffusion region 24 in the P-type well 20. An anode of the SCR is formed by a P$^+$ diffusion region 12 in the substrate 10. Another N$^+$ diffusion region 14 provides bias to the substrate 10. Therefore, the N$^+$ diffusion region 24, the P-type well 20, the N-type substrate 10 and the P$^+$ diffusion region 12 form an npnp SCR structure.

FIG. 2 illustrates the current flowing through the SCR device when a voltage is applied between the anode and the cathode. A snap-back in the current occurs when the applied voltage reaches a triggering voltage $V_T$. A great amount of current flows through the SCR when the voltage is slightly higher than the snap-back voltage $V_s$. Since the SCR provides a very large capacity for discharging current, it can be utilized in the integrated circuit as an ESD protection element. However, the triggering voltage of a conventional SCR is too high to be triggered by a lower electrostatic voltage. For example, an SCR having a triggering voltage of about 30 volts cannot be triggered by an electrostatic voltage of 20 volts which may be a voltage high enough to damage internal devices in the integrated circuit. Therefore, the SCR circuit is not appropriate for an output pad ESD protection circuit which has to resist a lower degree of electrostatic discharge.

On the other hand, as device dimensions decrease, breakdown voltages also decrease. Particularly for those devices having a thin gate oxide layer, any electrostatic voltage, even a weak one, may cause severe internal damage. Therefore, a conventional SCR cannot protect these devices from electrostatic discharge due to the SCR's high triggering voltage.

The conventional SCR shown in FIG. 1 includes two bipolar junction transistors Q1 and Q2. The equivalent circuit diagram of the SCR is illustrated in FIG. 3. When a voltage is applied to the anode or the cathode of the SCR, the base-emitter junctions of transistors Q1 and Q2 must be forward biased, or the SCR cannot be triggered to cause the snap-back effect. However, referring to FIG. 3, when a voltage is applied to either the anode or the cathode, one of the transistors Q1 and Q2 can be turned on, but the forward current of this transistor is not large enough to trigger the other transistor. Therefore, the overall triggering voltage of the SCR is very high.

SUMMARY OF THE INVENTION

Accordingly, the present invention provides an SCR circuit whose triggering voltage can be adjusted as desired.

In a general aspect of the invention, the SCR circuit is formed on a semiconductor substrate and includes a well region having a first diffusion region and a second diffusion region in the well region, and a third diffusion region in the substrate. A capacitor is connected between the first diffusion region and the third diffusion region. The first diffusion region is connected to the cathode of the SCR through a resistor. The third diffusion region forms the anode of the SCR. When an electrostatic force is applied to either the anode or the cathode, the voltage can be transferred to the other of the anode and the cathode through the capacitor. Therefore, the junction region between the well region and the diffusion region will be forward biased. That is, the base-emitter junctions of the equivalent bipolar junction transistors are forward biased to trigger the SCR. Moreover, the voltage required to trigger the SCR can be adjusted through the capacitor.

DETAILED DESCRIPTION OF THE INVENTION

Figure 1:
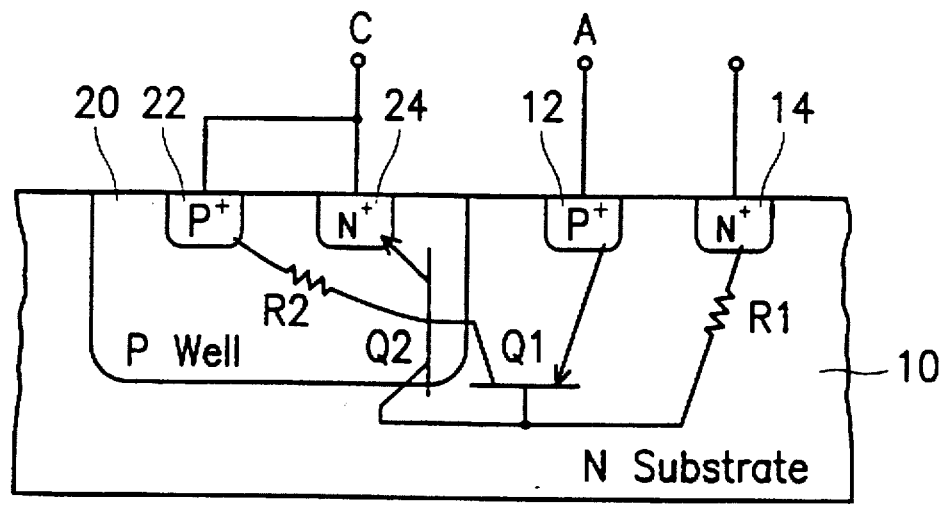
FIG. 1 is a cross-sectional view of a conventional SCR structure.
Figure 2:
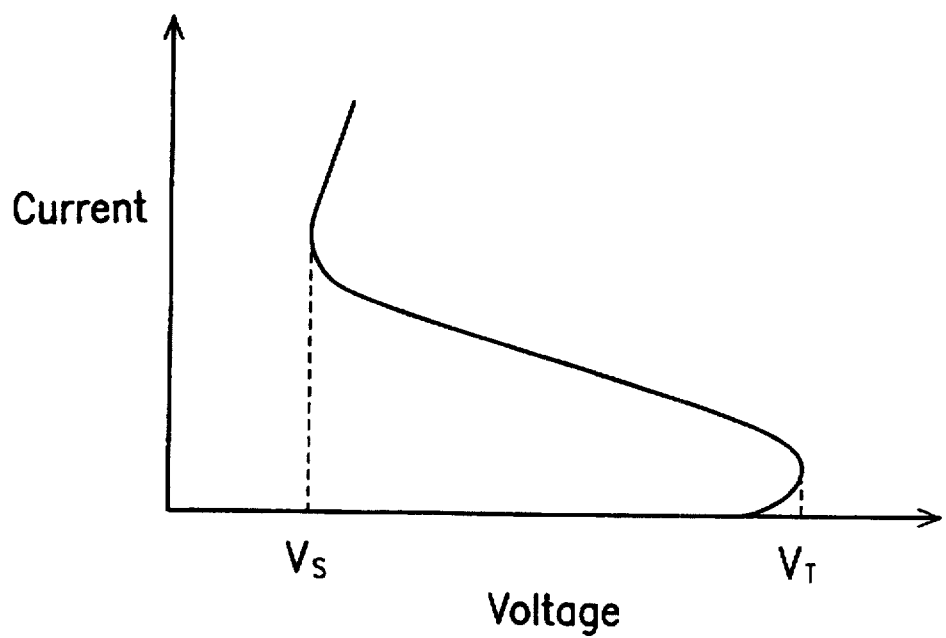
FIG. 2 illustrates a transfer characteristic of the SCR of FIG. 1.
Figure 3:
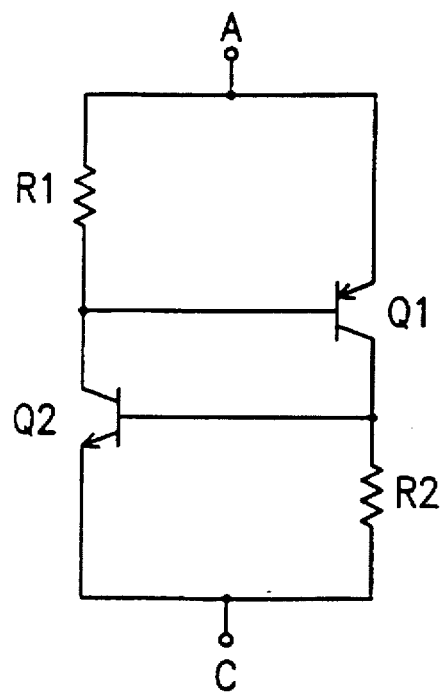
FIG. 3 is an equivalent circuit diagram of the SCR of FIG. 1.
Figure 4:
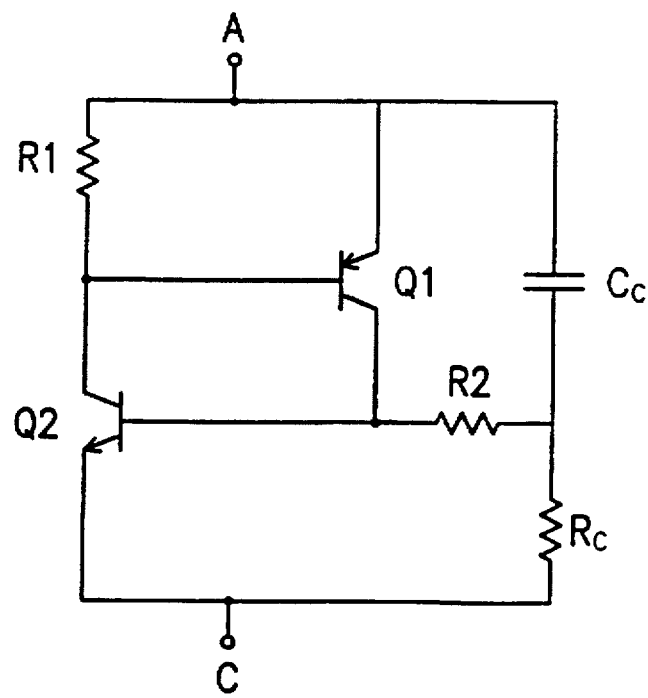
FIG. 4 illustrates an equivalent circuit of the SCR according to the preferred embodiment of the present invention.

Referring to FIG. 4, an SCR circuit of the present invention includes a first bipolar junction transistor Q1, a second bipolar junction transistor Q2 and a capacitor $C_c$. The anode of the SCR circuit is provided by the emitter of the first bipolar junction transistor Q1. The cathode of the SCR circuit is provided by the emitter of the second bipolar junction transistor Q2. The collector of the second bipolar junction transistor Q2 is connected to the base of the first bipolar junction transistor Q1. The base of the second bipolar junction transistor Q2 is connected to the collector of the first bipolar junction transistor Q1. The capacitor Cc is connected between the emitter of the first bipolar junction transistor Q1 and the base of the second bipolar junction transistor Q2.

Due to the coupling effect of the capacitor $C_c$, the two bipolar junction transistors Q1 and Q2 of the aforementioned SCR circuit can be easily turned on when an electrostatic force is applied to the anode or the cathode, thus discharging the electrostatic current in snap-back operation. The SCR circuit also includes resistors R2 and RC which affect the discharging capacity of the SCR circuit and has a value that can be adjusted. The resistor R2 may be in the form of a parasitic resistance existing between the base-emitter junction of transistor Q2. The resistor $R_c$ is utilized in the present invention to enhance the discharging performance of the circuit. This additional resistor $R_c$ can be connected between the collector of transistor Q1 and the emitter of transistor Q2. The RC constant of the SCR circuit is preferably adjusted to be in a range between 10–30 ns in the present embodiment. Therefore, the value of the capacitor $C_c$ is preferably about 0.1–3 pF.

Figure 5:
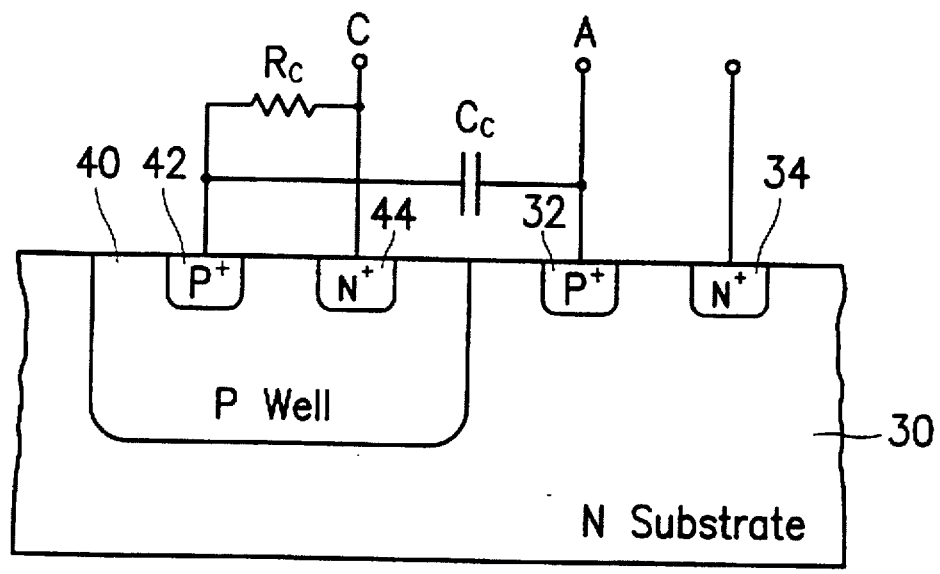
FIG. 5 is a cross-sectional view illustrating the SCR of the preferred embodiment.

FIG. 5 illustrates an SCR circuit of the present invention fabricated in a semiconductor substrate 30. The SCR circuit includes a well region 40, a first diffusion region 42, a second diffusion region 44, a third diffusion region 32 in the semiconductor substrate 30, and a capacitor $C_c$ connected between the first diffusion region 42 and the third diffusion region 32.

The well region 40 is a diffusion region in the semiconductor substrate 30 and has a conductivity type opposite to that of the semiconductor substrate 30. The first diffusion region 42 is in the well region 40 and has a conductivity type the same as that of the well region 40. The second diffusion region 44, which forms the cathode of the SCR circuit, is in the well region 40 and has a conductivity type opposite to that of the well region 40. The third diffusion region 32, which forms the anode of the SCR circuit, is in the semiconductor substrate 30 and has a conductivity type opposite to that of the semiconductor substrate 30.

There can be a fourth diffusion region 34 in the semiconductor substrate 30. The fourth diffusion region 34 has the same conductivity type as the semiconductor substrate 30, and is provided for connecting a voltage source to bias the semiconductor substrate 30.

Moreover, as discussed above, a resistor $R_c$ can be provided between the first diffusion region 42 and the second diffusion region 44 for adjusting the RC time constant of the SCR circuit.

In the present embodiment, the semiconductor substrate 30 is an N-type substrate, the well region 40 is a P-type well, the first diffusion region 42 is a P$^+$ diffusion region, the second diffusion region 44 is an N$^+$ diffusion region, and the third diffusion region 32 is a P$^+$ diffusion region. Therefore, the third diffusion region 32, the semiconductor substrate 30 and the well region form a lateral PNP bipolar junction transistor, i.e., the first transistor Q1 of FIG. 4. The semiconductor substrate 30, the well region 40 and the second diffusion region 44 form an NPN bipolar junction transistor, i.e., the second transistor Q2 of FIG. 4.

With the capacitor $C_c$ connected between the first diffusion region 42 and the third diffusion region 32, when an electrostatic force is applied to the SCR circuit, the force can be immediately coupled to the well region 40 to forward bias the junction of the second diffusion region 44 and the well region 40. Therefore, the first transistor Q1 and the second transistor Q2 can both be turned on, and the snap-back in the current occurs to discharge the electrostatic force.

Figure 6:
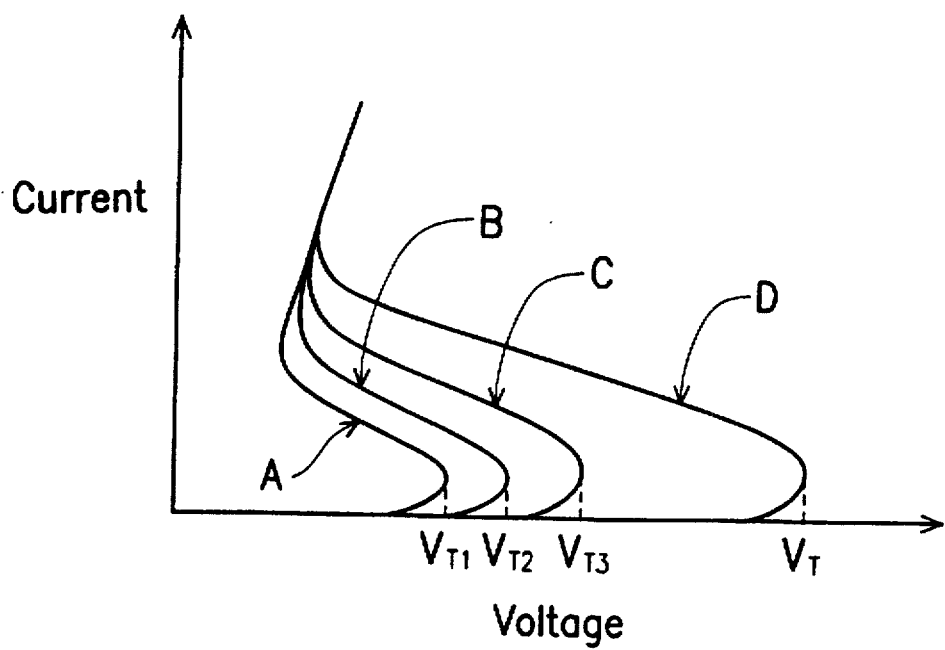
FIG. 6 illustrates a transfer characteristic of the SCR of FIG. 5.

The capacitor $C_c$ utilized in the present embodiment can be any capacitor that is compatible with an integrated circuit. For example, in a MOS integrated circuit, the capacitor $C_c$ can be a MOS capacitor which can be formed at the same time that the other MOS devices are fabricated. Moreover, the value of the capacitor $C_c$ affects the characteristics and performance of the SCR circuit. Referring to FIG. 6, the transfer characteristics of an SCR circuit for various $C_c$ values are compared. The SCR circuit with a capacitor $C_c$ of 3pF has a transfer characteristic of Line A, in which the triggering voltage VT1 is about 6 volts. Line B represents the transfer characteristic of the same SCR circuit with a capacitor $C_c$ of 1pF. The triggering voltage $V_{t2}$ of the circuit with a capacitor $C_c$ of 1pF is about 10 volts. As the value capacitor $C_c$ is reduced to 0.1 pF, the transfer characteristic of the SCR moves to line C which has a triggering voltage $V_{t3}$ of about 15 volts. The SCR circuit without capacitor $C_c$ has a transfer characteristic at Line D in which the triggering voltage $V_t$ is about 30 volts.

Figure 7:
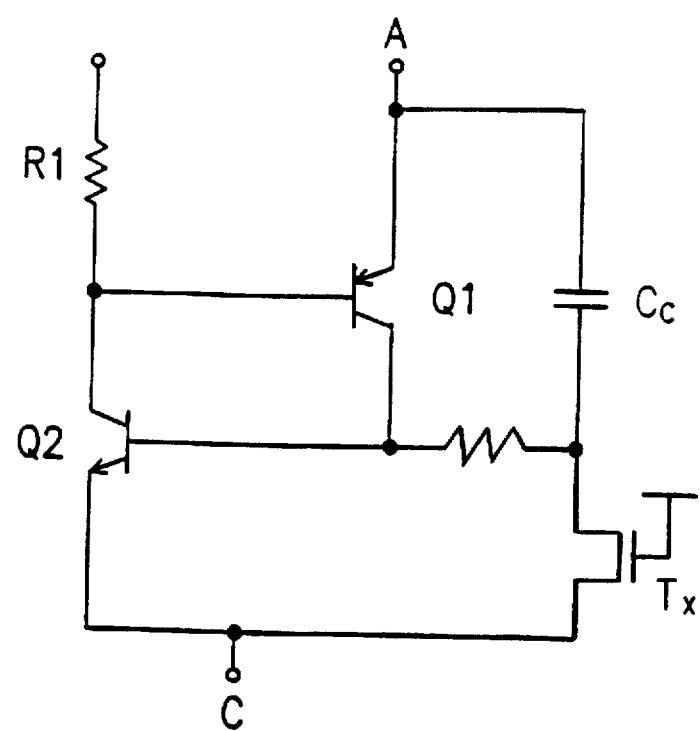
FIG. 7 illustrates an equivalent circuit of the SCR according to another embodiment of the present invention.

The additional resistor $R_c$ in the present invention can be formed by any resistor element. For example, referring to FIG. 7, a MOS transistor Tx is utilized as resistor $R_c$. The drain of transistor Tx is connected to the collector of the first bipolar junction transistor Q1. The source is connected to the emitter of the second bipolar junction transistor Q2. The gate is connected to a voltage source. Mapping the equivalent circuit of FIG. 7 to the cross-sectional view of FIG. 5, the drain of transistor Tx would be connected to the first diffusion region 42, the source connected to the second diffusion region 44, and the gate connected to a voltage source (not shown in the FIG.).

The present invention utilizes a capacitor $C_c$ to couple an electrostatic force of the SCR circuit, and turn on both bipolar junction transistors in the circuit (i.e., forward biasing the junction between well region and diffusion region). With this configuration the snap-back in current can discharge the electrostatic force to protect an integrated circuit. Because the triggering voltage of the scr circuit is reduced through the present invention, the electrostatic protection of the integrated circuit is improved.

What is claimed is:

1. A silicon controlled rectifier (SCR) circuit implemented as an IC circuit comprising:

a semiconductor substrate of a first conductivity type;

a well region in said semiconductor substrate of a second conductivity type opposite to that of said semiconductor substrate;

a first diffusion region in said well region of the second conductivity type;

a second diffusion region in said well region of the first conductivity type, wherein said second diffusion region is a cathode of said SCR;

a third diffusion region in said semiconductor substrate, of the second conductivity type, wherein said third diffusion region is an anode of said SCR;

a capacitor connected between said first diffusion region and said third diffusion region.

2. The SCR circuit as claimed in claim 1 further comprising a resistor connected between said first diffusion region and said second diffusion region.

3. The SCR circuit as claimed in claim 1, wherein said semiconductor substrate is an N-type substrate, said well region is a P-type well, said first diffusion region is a P$^+$ diffusion region, said second diffusion region is an N$^+$ diffusion region, and said third diffusion region is a P$^+$ diffusion region.

4. The SCR circuit as claimed in claim 1 further including a MOS device whose drain is connected to said first diffusion region, whose source is connected to said second diffusion region, and whose gate is connected to a voltage source.

5. A silicon controlled rectifier (SCR) circuit comprising:

a first bipolar junction transistor having a base, emitter and collector;

a second bipolar junction transistor having a collector connected to the base of said first bipolar junction transistor, a base connected to the collector of said first bipolar junction transistor, and an emitter which forms the cathode of said SCR; and a capacitor connected between the emitter of said first bipolar junction transistor and the base of said second bipolar junction transistor.

6. The SCR circuit as claimed in claim 5 further comprising a resistor connected between said collector of said first bipolar junction transistor and said emitter of said second bipolar junction transistor.

7. The SCR circuit as claimed in claim 5 further comprising a MOS device having a drain connected to said collector of said first bipolar junction transistor, a source connected to said emitter of said second bipolar junction transistor, and a gate connected to a voltage source.

8. The SCR circuit as claimed in claim 5, wherein said first bipolar junction transistor is a PNP transistor, and said second bipolar junction transistor is an NPN transistor.

* * * * *